(12) United States Patent
Tanie et al.

(10) Patent No.: US 8,053,908 B2
(45) Date of Patent: Nov. 8, 2011

(54) SEMICONDUCTOR DEVICE

(75) Inventors: Hisashi Tanie, Mito (JP); Nobuhiko Chiwata, Matsue (JP); Motoki Wakano, Yasugi (JP); Takeyuki Itabashi, Hitachi (JP)

(73) Assignee: Hitachi Metals, Ltd., Tokyo (JP)

( * ) Notice: Subject to any disclaimer, the term of this patent is extended or adjusted under 35 U.S.C. 154(b) by 92 days.

(21) Appl. No.: 12/694,298

(22) Filed: Jan. 27, 2010

(65) Prior Publication Data

US 2010/0193936 A1 Aug. 5, 2010

(30) Foreign Application Priority Data

Jan. 29, 2009 (JP) ................................. 2009-017479

(51) Int. Cl.
*H01L 23/48* (2006.01)
*H01L 23/52* (2006.01)
*H01L 29/40* (2006.01)

(52) U.S. Cl. ........................................ 257/781; 257/778
(58) Field of Classification Search .................. 257/780, 257/781, 778, 779, 782, 783, 788
See application file for complete search history.

(56) References Cited

U.S. PATENT DOCUMENTS

| | | | | |
|---|---|---|---|---|
| 2007/0075435 A1* | 4/2007 | Suminoe et al. | ............ | 257/777 |
| 2008/0251281 A1* | 10/2008 | Buchwalter et al. | .......... | 174/255 |
| 2010/0171209 A1* | 7/2010 | Tanie et al. | ............ | 257/686 |
| 2010/0230143 A1* | 9/2010 | Buchwalter et al. | .......... | 174/255 |
| 2011/0095431 A1* | 4/2011 | Furman et al. | ............ | 257/762 |

FOREIGN PATENT DOCUMENTS

JP 11-103156 4/1999

OTHER PUBLICATIONS

Japan Electronics and Information Technology Industries Association; Japan Jisso Technology Roadmap Council Jun. 2007.
Takayoshi Kashiwamura et al.; Optimization of nonlinear problem in Taguchi's method; Asakura Publishing Co., Ltd.

* cited by examiner

*Primary Examiner* — S. V. Clark
(74) *Attorney, Agent, or Firm* — Antonelli, Terry, Stout & Kraus, LLP.

(57) ABSTRACT

A novel structure capable of reducing the stress in the insulating layer in the semiconductor element and thereby securing reliability is provided. When the semiconductor element and the substrate are connected with a solder, the stress generated in the insulating layer is reduced by placing a spherical core made of a material having a greater rigidity inside the solder and satisfying the following inequalities: 1 GPa<(Young's modulus of a encapsulation resin)<30 GPa, 20 ppm/k<(linear coefficient of expansion of the encapsulation resin)<200 ppm/k, and 10 MPa<(yield stress of the solder at room temperature)<30 MPa. At the time of connection, the thickness of the solder to be placed between the land on the surface of the semiconductor element and the core is adjusted to 1/10 or less of the terminal pitch.

7 Claims, 16 Drawing Sheets

FIG. 5
(a) PORTION USED AS A MODEL
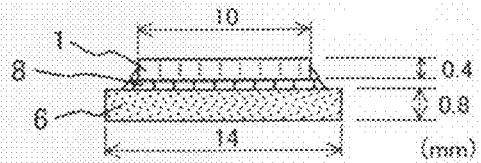
(b) OVERALL VIEW OF THE MODEL
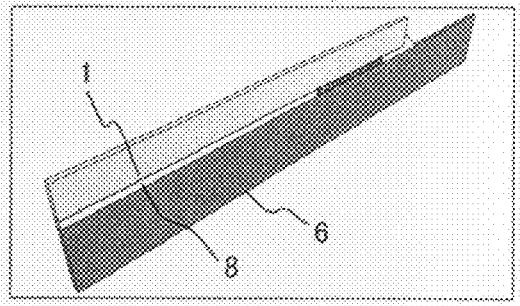
(c) MESH DIAGRAM
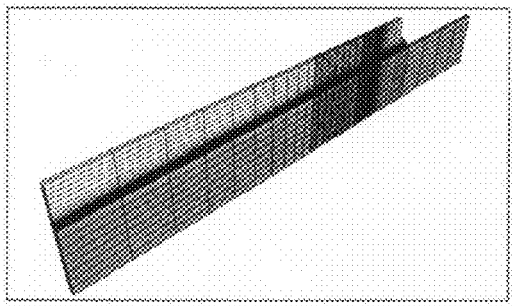
(d) TWO-DIMENSIONAL MESH DIAGRAM
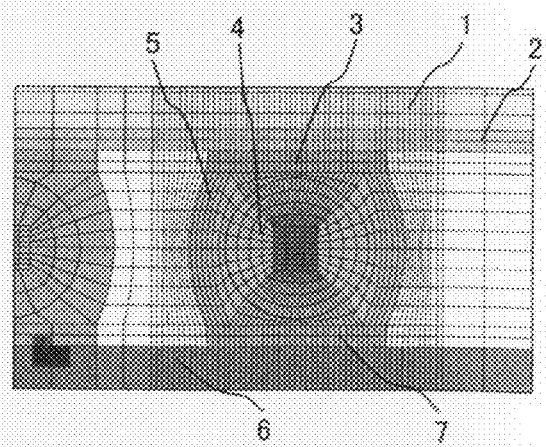
(e) THREE-DIMENSIONAL MESH DIAGRAM
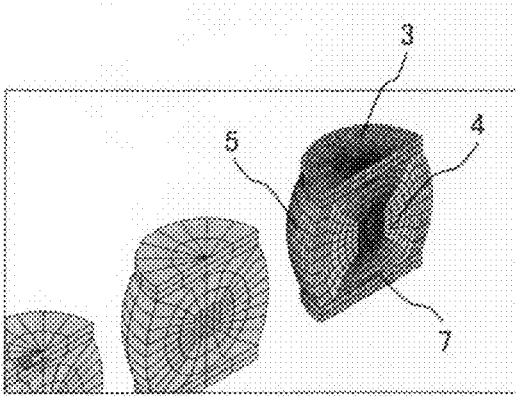

CONTROL FACTORS AND LEVELS

|   | CONTROL FACTORS | UNIT | LEVEL 1 | LEVEL 2 | LEVEL 3 |
|---|---|---|---|---|---|
| A | CORE-SOLDER SPACE | μm | 0 | 10 | — |
| B | INSULATING LAYER THICKNESS | μm | 5 | 10 | 15 |
| C | THICKNESS OF CHIP-SIDE LAND | μm | 0 | +10 | +20 |
| D | SOLDER HEIGHT | μm | −10 | 0 | +10 |
| E | SOLDER $\sigma y$ | MPa | 18 | 24 | 30 |
| F | YOUNG'S MODULUS OF ENCAPSULATION RESIN | GPa | 1 | 5 | 9 |
| G | LINEAR COEFFICIENT OF EXPANSION OF ENCAPSULATION RESIN | ppm/K | 20 | 40 | 60 |
| H | SUBSTRATE THICKNESS | μm | 300 | 800 | 1300 |

*COLUMN A APPLIES TO ONLY EMBODIMENT 1

FIG. 8B

ORTHOGONAL ARRAY

| No. | A CORE-SOLDER SPACE | B INSULATING LAYER THICKNESS | C THICKNESS OF LAND | D SOLDER HEIGHT | E SOLDER $\sigma y$ | F YOUNG'S MODULUS OF ENCAPSULATION RESIN | G LINEAR COEFFICIENT OF EXPANSION OF ENCAPSULATION RESIN | H SUBSTRATE THICKNESS |
|---|---|---|---|---|---|---|---|---|
| 1 | 0 | 5 | 0 | −10 | 18 | 1 | 20 | 300 |
| 2 | 0 | 5 | +10 | 0 | 24 | 5 | 40 | 800 |
| 3 | 0 | 5 | +20 | +10 | 30 | 9 | 60 | 1300 |
| 4 | 0 | 10 | 0 | −10 | 24 | 5 | 60 | 1300 |
| 5 | 0 | 10 | +10 | 0 | 30 | 9 | 20 | 300 |
| 6 | 0 | 10 | +20 | +10 | 18 | 1 | 40 | 800 |
| 7 | 0 | 15 | 0 | 0 | 18 | 9 | 40 | 1300 |
| 8 | 0 | 15 | +10 | +10 | 24 | 1 | 60 | 300 |
| 9 | 0 | 15 | +20 | −10 | 30 | 5 | 20 | 800 |
| 10 | 10 | 5 | 0 | +10 | 30 | 5 | 40 | 300 |
| 11 | 10 | 5 | +10 | −10 | 18 | 9 | 60 | 800 |
| 12 | 10 | 5 | +20 | 0 | 24 | 1 | 20 | 1300 |
| 13 | 10 | 10 | 0 | 0 | 30 | 1 | 60 | 800 |
| 14 | 10 | 10 | +10 | +10 | 18 | 5 | 20 | 1300 |
| 15 | 10 | 10 | +20 | −10 | 24 | 9 | 40 | 300 |
| 16 | 10 | 15 | 0 | +10 | 24 | 9 | 20 | 800 |
| 17 | 10 | 15 | +10 | −10 | 30 | 1 | 40 | 1300 |
| 18 | 10 | 15 | +20 | 0 | 18 | 5 | 60 | 300 |

FIG. 10A

| No. | CONTROL FACTORS | | | | | | | | ANALYSIS RESULTS ($\sigma_{p1}$) | |
|---|---|---|---|---|---|---|---|---|---|---|
| | A | B | C | D | E | F | G | H | | |
| | CORE-SOLDER SPACE | INSULAT-ING LAYER THICKNESS | THICKNESS OF LAND | SOLDER HEIGHT | SOLDER $\sigma y$ | YOUNG'S MODULUS OF ENCAP-SULATION RESIN | LINEAR CO-EFFICIENT OF EXPANSION OF ENCAPSU-LATION RESIN | SUB-STRATE THICK-NESS | CONVEN-TIONAL STRUC-TURE A | INVEN-TION STRUC-TURE |
| 1 | 0 | 5 | 0 | −10 | 18 | 1 | 20 | 300 | 30.7 | 65.6 |
| 2 | 0 | 5 | +10 | 0 | 24 | 5 | 40 | 800 | 100.8 | 192.7 |
| 3 | 0 | 5 | +20 | +10 | 30 | 9 | 60 | 1300 | 200.2 | 301.9 |
| 4 | 0 | 10 | 0 | −10 | 24 | 5 | 60 | 1300 | 144.3 | 283.0 |
| 5 | 0 | 10 | +10 | 0 | 30 | 9 | 20 | 300 | 19.6 | 34.4 |
| 6 | 0 | 10 | +20 | +10 | 18 | 1 | 40 | 800 | 57.8 | 142.8 |
| 7 | 0 | 15 | 0 | 0 | 18 | 9 | 40 | 1300 | 54.0 | 141.9 |
| 8 | 0 | 15 | +10 | +10 | 24 | 1 | 60 | 300 | 80.3 | 232.1 |
| 9 | 0 | 15 | +20 | −10 | 30 | 5 | 20 | 800 | 23.9 | 25.5 |
| 10 | 10 | 5 | 0 | +10 | 30 | 5 | 40 | 300 | 75.0 | 79.3 |
| 11 | 10 | 5 | +10 | −10 | 18 | 9 | 60 | 800 | 230.7 | 30.3 |
| 12 | 10 | 5 | +20 | 0 | 24 | 1 | 20 | 1300 | 15.2 | 13.3 |
| 13 | 10 | 10 | 0 | 0 | 30 | 1 | 60 | 800 | 96.7 | 91.8 |
| 14 | 10 | 10 | +10 | +10 | 18 | 5 | 20 | 1300 | 10.5 | 7.6 |
| 15 | 10 | 10 | +20 | −10 | 24 | 9 | 40 | 300 | 114.9 | 27.8 |
| 16 | 10 | 15 | 0 | +10 | 24 | 9 | 20 | 800 | 8.6 | 7.0 |
| 17 | 10 | 15 | +10 | −10 | 30 | 1 | 40 | 1300 | 66.7 | 39.0 |
| 18 | 10 | 15 | +20 | 0 | 18 | 5 | 60 | 300 | 137.0 | 50.9 |

FIG. 10B

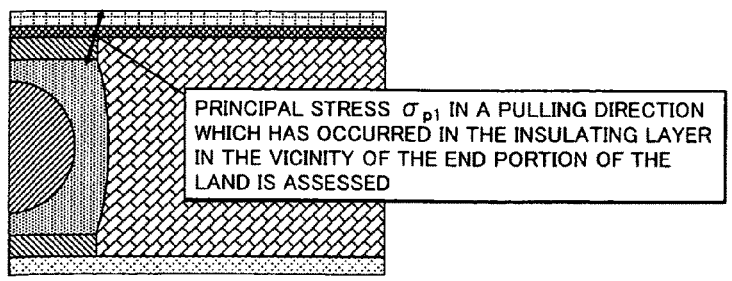

PRINCIPAL STRESS $\sigma_{p1}$ IN A PULLING DIRECTION WHICH HAS OCCURRED IN THE INSULATING LAYER IN THE VICINITY OF THE END PORTION OF THE LAND IS ASSESSED

| | SOLDER $\sigma y$ | YOUNG'S MODULUS OF ENCAPSULA-TION RESIN | LINEAR COEFFICIENT OF EXPANSION OF ENCAPSULATION RESIN | CONVEN-TIONAL STRUC-TURE A | INVENTION STRUCTURE | (STRESS OF STRUCTURE OF EMBODIMENT 1)/ (STRESS OF CONVENTIONAL STRUCTURE A) |
|---|---|---|---|---|---|---|
| 1 | 18 | 1 | 20 | 77.11 | 68.58 | 0.89 |
| 2 | 18 | 1 | 40 | 57.86 | 35.39 | 0.61 |
| 3 | 18 | 1 | 60 | 51.05 | 38.66 | 0.76 |
| 4 | 18 | 5 | 20 | 48.26 | 42.39 | 0.88 |
| 5 | 18 | 5 | 40 | 42.42 | 28.52 | 0.67 |
| 6 | 18 | 5 | 60 | 53.81 | 35.43 | 0.66 |
| 7 | 18 | 9 | 20 | 37.52 | 32.68 | 0.87 |
| 8 | 18 | 9 | 40 | 42.08 | 29.6 | 0.70 |
| 9 | 18 | 9 | 60 | 61.3 | 45.15 | 0.74 |
| 10 | 24 | 1 | 20 | 73.89 | 67.16 | 0.91 |
| 11 | 24 | 1 | 40 | 56.87 | 35.52 | 0.62 |
| 12 | 24 | 1 | 60 | 50.5 | 39.7 | 0.79 |
| 13 | 24 | 5 | 20 | 47.44 | 42.03 | 0.89 |
| 14 | 24 | 5 | 40 | 42.62 | 29.2 | 0.69 |
| 15 | 24 | 5 | 60 | 54.05 | 36.02 | 0.67 |
| 16 | 24 | 9 | 20 | 37.14 | 32.48 | 0.87 |
| 17 | 24 | 9 | 40 | 42.27 | 30.12 | 0.71 |
| 18 | 24 | 9 | 60 | 61.48 | 45.55 | 0.74 |
| 19 | 30 | 1 | 20 | 71.41 | 66.12 | 0.93 |
| 20 | 30 | 1 | 40 | 55.9 | 35.78 | 0.64 |
| 21 | 30 | 1 | 60 | 50.05 | 40.72 | 0.81 |
| 22 | 30 | 5 | 20 | 46.76 | 41.79 | 0.89 |
| 23 | 30 | 5 | 40 | 42.83 | 29.92 | 0.70 |
| 24 | 30 | 5 | 60 | 54.3 | 36.58 | 0.67 |
| 25 | 30 | 9 | 20 | 36.81 | 32.39 | 0.88 |
| 26 | 30 | 9 | 40 | 42.47 | 30.63 | 0.72 |
| 27 | 30 | 9 | 60 | 61.66 | 45.94 | 0.75 |

SEMICONDUCTOR DEVICE

CLAIM OF PRIORITY

The present application claims priority from Japanese patent application serial No. 2009-017479 filed on Jan. 29, 2009, the content of which is hereby incorporated by reference into this application

BACKGROUND OF THE INVENTION

1. Field of the Invention

The present invention relates to a mounting technology of a semiconductor device.

2. Description of the Related Art

Various types of information equipment such as large-scale computers, personal computers, and mobile devices are becoming increasingly sophisticated and downsized year by year. Semiconductor devices mounted on such equipment are therefore required to have as many elements, interconnects, and terminals as possible within a limited size range. There is however a problem that when interconnects are made smaller, a distance between them inside a semiconductor device decreases, leading to an increase in an electrostatic capacitance between adjacent interconnects. A technology using a material having a low electric permissivity as an insulating material disposed between interconnects is developed in order to overcome this problem.

As a technology of closely contacting and connecting a terminal of a semiconductor element with a substrate on which the semiconductor element is to be mounted, there are developed a connection structure using a solder ball which structure is disclosed in "Japan Electronics and Information Technology Industries Association, *Japan Jisso Technology Roadmap* 2007", a connection structure using protrusions disposed on the surface of a semiconductor element to connect the protrusions with the substrate, and a connection structure using a solder ball having a core inside thereof which structure is disclosed in Japanese Patent Laid-Open No. 103156/1999.

The reliability of connections in products having semiconductor mounted thereon is governed by numerous factors such as connection structure, shape or size of each member, materials composing each member, and the like. As a technology of balancing these many factors including them, there is developed Taguchi's method which is disclosed in "Takayoshi Kashiwamura, et al., *Optimization of nonlinear problem in Taguchi's method*, published by Asakura Publishing Co., Ltd.". In this method, experiments are made on conditions determined using an orthogonal array, whereby effects of each factor can be assessed efficiently without carrying out many experiments. When respective effects of many factors are independent each other, assessment can be made with high accuracy. A large interaction between these factors, on the other hand, leads to low accuracy.

Accordingly, when respective factors are balanced by using this method, it is effective to clarify the mechanism of a phenomenon to be assessed in advance and extract factors which are independent each other (or factors or ranges regarded to be independent from each other). Even if the method is applied to a phenomenon having an unknown mechanism, it is difficult to balance these factors.

Porous materials have been developed as a material having a low electric permittivity and used for insulating materials between interconnects of a semiconductor element. In general, these porous materials have a high porosity in order to attain a sufficient low electric permittivity so that their material strength is low. Insulating materials are placed as a thin insulating layer over the surface of a semiconductor element. They have, inside thereof, an interconnect structure such as multilayer interconnect and interconnects are positioned at a distance as minute as from several µm to several tens nm. Further, the insulating layers have, over the surface thereof, connection terminals such as a metal land to a substrate, each made of copper or aluminum etc.

Silicon, that is, a material of the semiconductor element, has a linear coefficient of expansion of about 3 ppm/K, while copper and aluminum have linear coefficients of expansion of about 17 ppm/K and about 23 ppm/K, respectively. When the temperature near the insulating layer changes due to the behavior of semiconductor or change in the environmental temperature, a stress attributable to a difference in thermal deformation between silicon and the land occurs in the insulating layer. When this stress increases and exceeds the strength of the insulating material, cracks appear in the insulating layer and cause short-circuit or disconnection. Therefore, it becomes a major object to reduce a stress which will occur in the insulating layer and prevent the breakage of the insulating layer, thereby securing the reliability of a semiconductor device.

SUMMARY OF THE INVENTION

With a diagram to achieving the above-described object, the present invention provides a semiconductor device comprising a semiconductor element having, over the surface thereof, an insulating layer having therein an interconnect, a substrate over which the semiconductor element is to be mounted, and a plurality of connection terminals provided over the surface of the insulating layer of the semiconductor element and the surface of the substrate at a certain pitch; the semiconductor element being mounted over the substrate by solder-joining the connection terminals over the surface of the insulating layer of the semiconductor element with the connection terminals of the substrate; and the connection between the semiconductor element and the substrate being sealed with a encapsulation resin, wherein a substantially spherical core is provided inside of the solder at the connection between the semiconductor element and the substrate; the thickness of the solder placed between the connection terminals provided over the surface of the insulating layer of the semiconductor element and the core is adjusted to $\frac{1}{10}$ or less of a terminal pitch of the connection terminals over the surface of the insulating layer; and a Young's modulus and a linear coefficient of expansion of the encapsulation resin to be filled between the semiconductor element and the substrate, and a yield stress of the solder at room temperature are adjusted to satisfy the following inequalities: 1 GPa<(Young's modulus of the encapsulation resin)<30 GPa, 20 ppm/k<(linear coefficient of expansion of the encapsulation resin)<200 ppm/k, and 10 MPa<(yield stress of the solder at room temperature)<30 MPa.

In another aspect of the invention, there is also provided the semiconductor device, wherein the core is made of a material having a greater rigidity than that of the solder. In a further aspect of the invention, there is also provided the semiconductor device, wherein the core is made of nickel-plated copper, nickel, or molybdenum.

In a still further aspect, there is also provided the semiconductor device, wherein the connection-direction thickness of the connection terminals over the surface of the insulating layer of the semiconductor element is greater than the connection-direction thickness of the connection terminals on the substrate side.

In a still further aspect, there is also provided the semiconductor device, wherein the connection terminals over the surface of the insulating layer of the semiconductor element each have a rectangular cross-section in which the connection-direction thickness is smaller than the width-direction thickness.

A semiconductor device is used mainly at a temperature not greater than the curing temperature of a encapsulation resin. A solder connection is compressed as a result of thermal shrinkage of the encapsulation resin caused by a temperature drop. When a spherical core made of a material having a rigidity greater than that of the solder is placed inside the solder, a compression load concentrically acts on the land center, flexural deformation occurs in the land with a convex (concave on the core side) on the semiconductor element side, leading to elongation deformation on the semiconductor element side of the land.

By properly determining the Young's modulus and linear coefficient of expansion of the encapsulation resin and the yield stress of the solder, the elongation deformation sets off the thermal shrinkage deformation of the land, the thermal deformation on the surface of the land becomes smaller on the semiconductor element side, and the stress which may occur in the insulating layer due to a thermal deformation difference between silicon and the land decreases. As a result, the insulating layer can be protected from the breakage and the reliability of the semiconductor device can be secured.

BRIEF DESCRIPTION OF DRAWINGS

FIG. 5 is an explanatory diagram of a stress analysis model of the semiconductor device of the invention;

FIGS. 8A and 8B are explanatory diagrams illustrating the stress analysis conditions in the invention;

FIG. 10A is an explanatory diagram illustrating results of stress analysis in the invention;

FIG. 10B is a schematic diagram showing principal stress;

DETAILED DESCRIPTION OF THE PREFERRED EMBODIMENTS

Embodiments of the invention will next be described referring to some drawings.

Embodiment 1

Basic Structure of Semiconductor Device

Figure 1A:
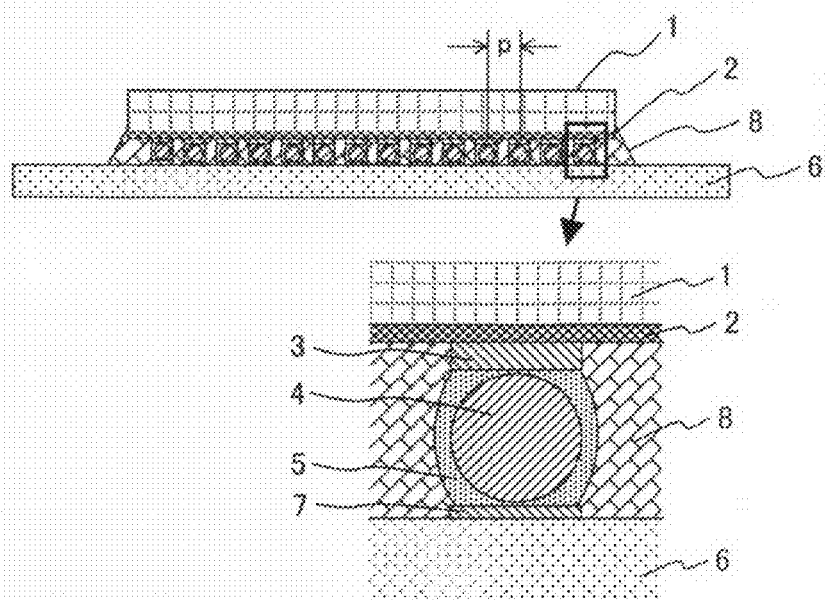
FIG. 1A is a schematic diagram illustrating the cross-section of a semiconductor device of Embodiment 1 of the invention.

FIG. 1A is an enlarged schematic diagram illustrating a portion of the cross-section of a semiconductor device having the characteristics of the invention. The semiconductor device has a semiconductor element 1 and an insulating layer 2 including an interconnect layer, which is not illustrated in this drawing, over the surface (lower surface) of the semiconductor element. A semiconductor-element-side land 3 is disposed over the lower surface of the insulating layer as a connection terminal to a substrate 6. In this Embodiment, the semiconductor element 1 is made of silicon having a thickness of 0.4 mm, the insulating layer 2 is made of polyimide having a thickness of 0.005 mm, and the semiconductor-element-side land 3 is made of copper having a thickness of 0.01 mm.

The semiconductor device has a plurality of the semiconductor-element-side lands 3 and they are disposed at a terminal pitch of 0.13 mm. Over the surface of the substrate 6, substrate-side lands 7 are disposed at the same pitch as that of the semiconductor-element-side lands 3. The semiconductor element 1 and the substrate 6 are connected by joining the semiconductor-element-side lands 3 and the substrate-side lands 7 with a solder 5 having a spherical core 4 inside thereof, whereby the electric conduction between the semiconductor element 1 and the substrate 6 can be secured.

At the time of connection, the thickness of the solder 5 to be placed between the semiconductor-element-side land 3 and the core 4 (core-solder space) can be controlled by the diameter of the core 4 so that the solder thickness can be controlled to an intended thickness with high accuracy. A encapsulation resin 8 is filled between the semiconductor element 1 and the substrate 6.

In Embodiment 1, the substrate 6 is a glass epoxy substrate having a thickness of 0.8 mm, the substrate-side land 7 is made of nickel-plated copper having a thickness of 0.01 mm, the core 4 is made of nickel-plated copper having a diameter of 0.065 mm, the solder 5 is a lead-free solder having an Sn-3Ag-0.5Cu composition, and the encapsulation resin 8 is an epoxy resin containing a filler.

For the core 4, a material having a greater rigidity than the solder 5 is used. With respect to the physical properties of the encapsulation resin 8, a Young's modulus is 5 GPa and a linear coefficient of expansion is 40 ppm/K at room temperature. The core 4 may alternatively be made of nickel, molybdenum, or the like.

Figure 1B:
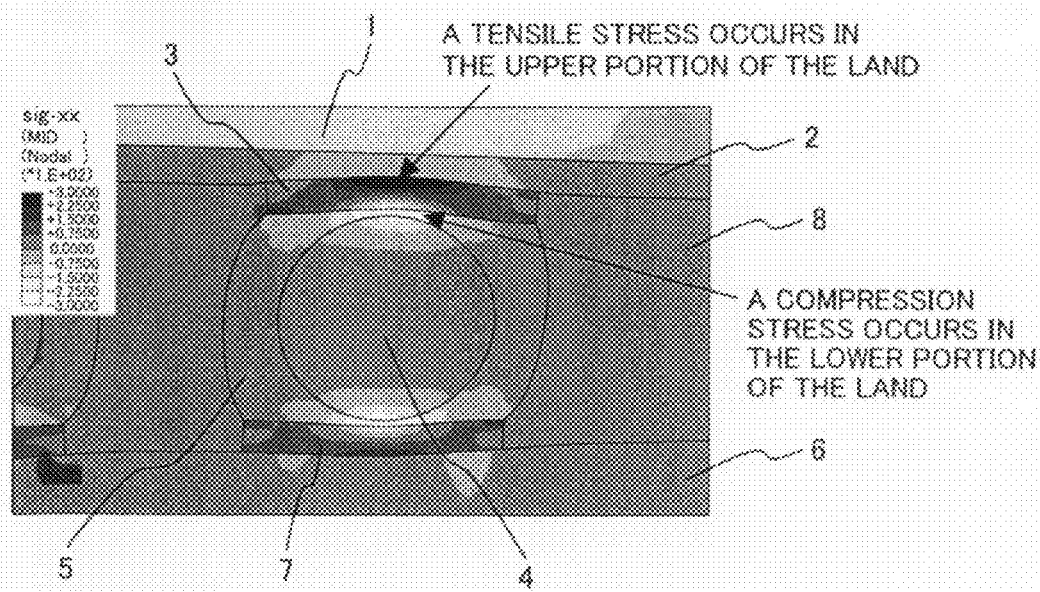
FIG. 1B is a deforming stress distribution chart of the semiconductor device of Embodiment 1 of the invention.

FIG. 1B is a deforming stress distribution chart (distribution of a stress σx in a horizontal direction) when the temperature of the whole structure drops in Embodiment 1. In this drawing, a darker shaded area in a gray zone shows that a large tensile stress occurs therein, while a lighter shaded area in the gray zone shows that a large compression stress occurs therein. The semiconductor-element-side land 3 undergoes an upward convex flexural deformation. A tensile stress and a compression stress occur in the upper portion and the lower portion of the semiconductor-element-side land 3, respectively.

This mechanism is presumed to occur as follows. Since the encapsulation resin 8 has a greater linear coefficient of expansion than the solder 5 or core 4, it undergoes large thermal shrinkage due to a temperature drop and compresses the solder 5 or core 4. When a spherical core 4 made of copper, which is a material having a greater rigidity than the solder, is placed inside the solder 5 and the thickness of a solder layer placed between the connection terminal (land) and the core (core-solder space) is reduced, the compression load concentrically acts on the center of the semiconductor-element-side land 3.

As a result, flexural deformation with a convex (concave on the core side) on the semiconductor element side occurs in the semiconductor-element-side land 3. The resulting flexural deformation causes a tensile stress in a horizontal direction on the semiconductor element side of the semiconductor-element-side land 3 and a compression stress occurs in a horizontal direction on the core side.

The entirety of the semiconductor-element-side land 3, on the other hand, undergoes thermal shrinkage due to a temperature drop. The horizontal-direction tensile stress that occurs on the semiconductor element side of the semiconductor-element-side land 3 partially offsets this thermal shrinkage so that thermal deformation in the surface on the semiconductor element side of the semiconductor-element-side land 3 decreases and approximates the thermal deformation of silicon, leading to a decrease in a stress that occurs in the insulating layer due to a thermal deformation difference between silicon and the land. As a result, the insulating layer can be protected from breakage and the reliability of the semiconductor device can be secured.

(Stress Reducing Mechanism)

Figure 2A:
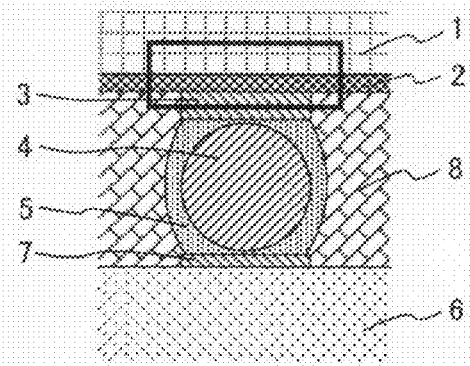
FIG. 2 is a schematic diagram illustrating the mechanism of the invention.
Figure 2B:
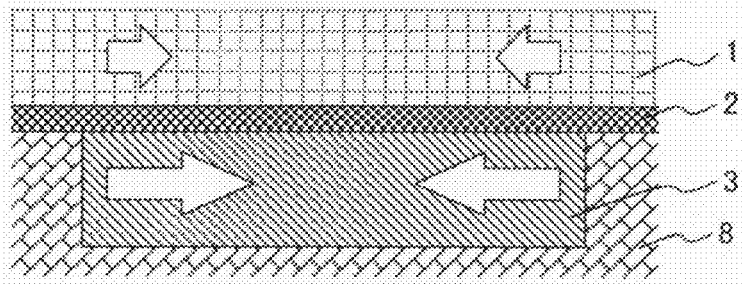

The above-described stress reducing mechanism in the insulating layer will next be described referring to the schematic diagram of FIG. 2. The vicinity of the insulating layer 2 above the connection, which is surrounded by a bold frame in FIG. 2(a), is enlarged in FIGS. 2(b) and 2(c). FIG. 2(b) schematically illustrates a strain due to thermal deformation of each material.

Compared with a linear coefficient of expansion (about 3 ppm/K) of silicon which is a material of the semiconductor element 1, a linear coefficient of expansion (about 17 ppm/K) of copper which is a material of the semiconductor-element-side land 3 is greater, meaning that a thermal deformation amount at the time of a temperature drop is greater in the semiconductor-element-side land 3 than in the semiconductor element 1.

A stress therefore occurs in the insulating layer 2 disposed between the semiconductor-element-side land 3 and the semiconductor element 1 due to a thermal deformation difference between the semiconductor-element-side land 3 and the semiconductor element 1. In particular, a tensile stress occurs in the insulating layer 2 in the vicinity of the end portion of the semiconductor-element-side land 3 because it is pulled by the semiconductor-element-side land 3.

Figure 2C:
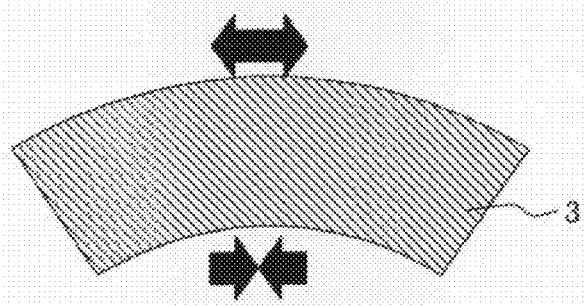

FIG. 2(c) schematically shows a strain caused by flexural deformation of the semiconductor-element-side land 3. When the semiconductor-element-side land 3 undergoes flexural deformation with a convex up, a tensile strain occurs in the upper surface and a compression strain occurs in the lower surface.

In the actual semiconductor-element-side land 3, the strain illustrated in FIG. 2(b) and the strain illustrated in FIG. 2(c) occur simultaneously. As a result, the strain is partially offset in the upper surface of the semiconductor-element-side land 3 and the thermal deformation becomes small, while the strains overlap in the lower surface and the thermal deformation becomes large therein.

In Embodiment 1, the insulating layer 2 is placed between the lower surface of the semiconductor element 1 and the upper surface of the semiconductor-element-side land 3. According to the above-described mechanism, with a decrease in the thermal deformation in the upper surface of the semiconductor-element-side land 3, a difference in thermal deformation between the land and the semiconductor element 1 decreases and the stress and deformation generated in the insulating layer 2 can be reduced.

Figure 3A:
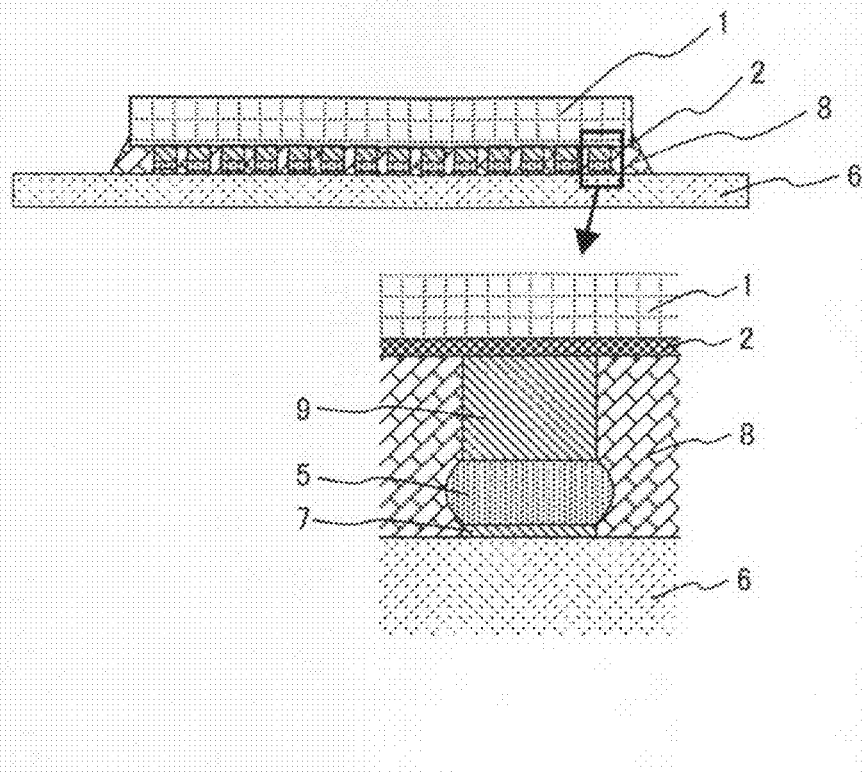
FIG. 3A is a schematic diagram illustrating a conventional structure A of a semiconductor device.

In FIGS. 3A to 4B, the conventional structures A and B are illustrated to compare them with the structure of Embodiment 1. FIG. 3A illustrates the conventional structure A of a semiconductor device. A semiconductor element 1 is mounted on a substrate 6 by solder-joining a protrusion 9 placed on the lower surface of an insulating layer 2 and a substrate-side land 7. A solder 5 does not contain a core therein. The protrusion 9 on the side of the semiconductor element is a copper pillar or stud bump formed by plating.

Figure 3B:
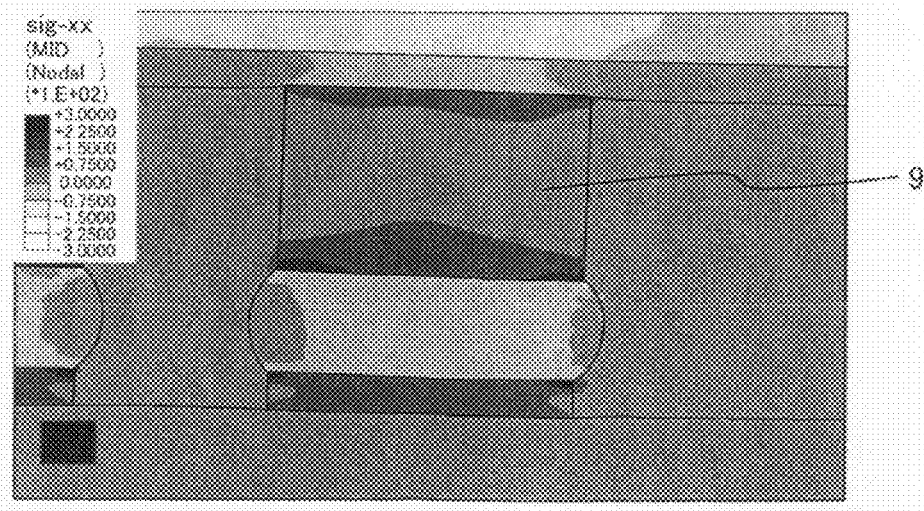
FIG. 3B is a deforming stress distribution chart of the conventional structure A of a semiconductor device.

FIG. 3B is a deforming stress distribution chart (distribution of a stress σx in a horizontal direction) when the temperature of the entire structure drops. Different from the structure of Embodiment 1 illustrated in FIGS. 1A and 1B, this structure causes no flexural deformation in the protrusion 9 on the side of the semiconductor element facing with the insulating layer 2 during a temperature drop so that it cannot receive the insulating-layer stress reducing effect of the invention.

Figure 4A:
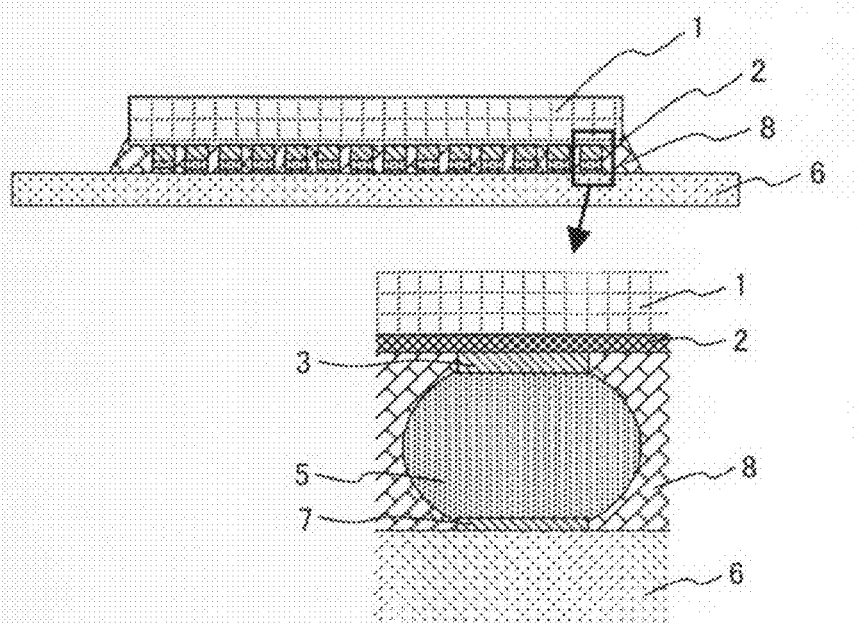
FIG. 4A is a schematic diagram illustrating a conventional structure B of a semiconductor device.

FIG. 4A is a schematic diagram of the conventional structure B. A semiconductor element 1 is mounted on a substrate 6 by solder-joining a semiconductor-element-side land 3 disposed on the lower surface of an insulating layer 2 and a substrate-side land 7.

A difference from the structure of Embodiment 1 is that since a solder 5 does not contain therein a core and a solder height cannot therefore be secured, a connection height becomes small and a horizontal width of a solder ball becomes large. When the connection height is small, it becomes difficult to insert a encapsulation resin between the semiconductor element 1 and the substrate 6 after the former is mounted on the latter. When the horizontal width of the solder ball becomes large, it becomes difficult to place terminals at a narrow pitch.

Figure 4B:
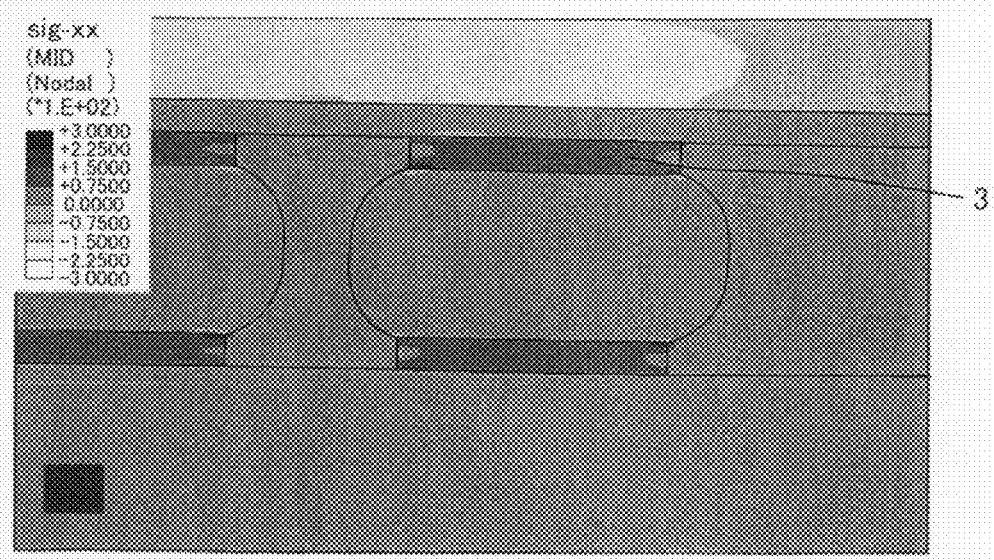
FIG. 4B is a deforming stress distribution chart of the conventional structure B of a semiconductor device.

FIG. 4B is a deformation stress distribution chart (distribution of a stress σx in a horizontal direction) when the temperature of the entire structure drops. Similar to the conventional structure A, this structure undergoes no flexural deformation in the semiconductor-element-side land 3 facing the insulating layer 2 during the temperature drop so that it cannot receive the insulating-layer stress reducing effect of the invention.

The insulating-layer stress reducing effect was confirmed by using a stress analysis model illustrated in the explanatory diagram of FIG. 5 in accordance with stress analysis using a computer. The analysis model was obtained by cutting out a three-dimensional shape corresponding to a ½ pitch at the center portion of the semiconductor device. With regard to the cut face, a boundary condition was set to satisfy symmetry.

FIG. 5(a) illustrates a portion of the semiconductor device employed as an analysis model; FIG. 5(b) is an overall diagram of the model; FIG. 5(c) is a mesh diagram of the analysis model; FIG. 5(d) is a two-dimensional mesh diagram of the vicinity of an end bump; and FIG. 5(e) is a three-dimensional mesh diagram of the vicinity of the end bump.

Figure 6A:
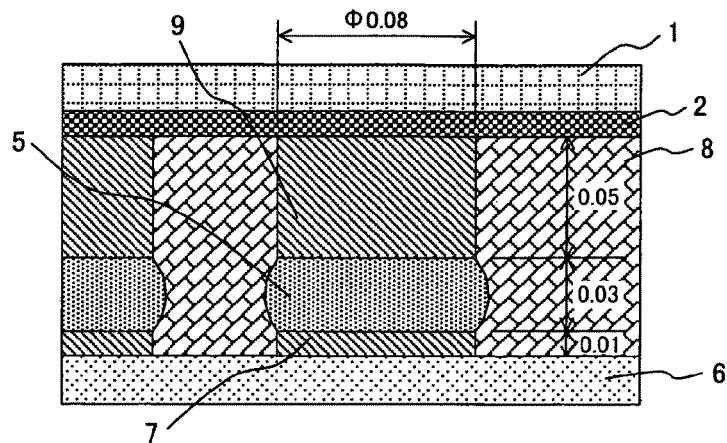
FIG. 6A to 6C are schematic diagrams illustrating the stress analysis conditions in the invention.
Figure 6B:
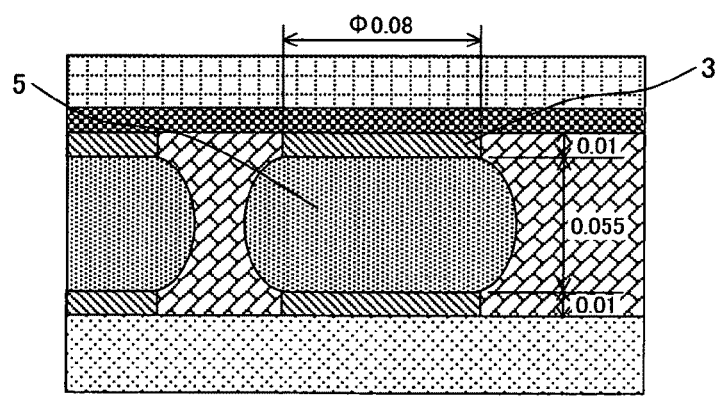
Figure 6C:
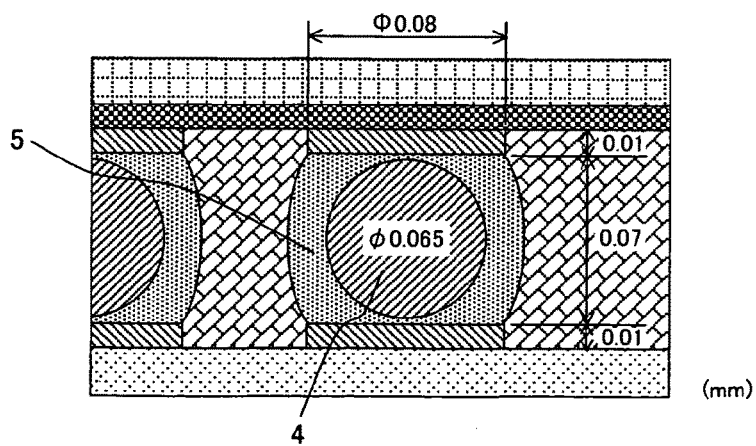

Three connection structures are illustrated in FIG. 6A to 6C. That is, the conventional structure A in FIG. 6A, the conventional structure B in FIG. 6B, and the structure of Embodiment 1 illustrated in FIG. 6C. These are the objects of the stress analysis. The connection height of the conventional structure in FIG. 6A is the same as that of the structure of Embodiment 1, while the connection height of the conventional structure in FIG. 6B is smaller.

It is determined from the shape of the solder when the terminal pitch is set at 0.13 mm. The reason why the thickness range of the solder is defined by the terminal pitch is because the connection structures of a semiconductor device have a substantially similar shape mainly with a terminal pitch as a standard.

Figure 7A:
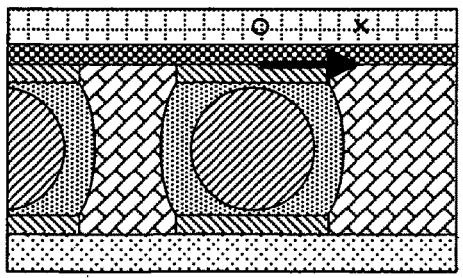
FIG. 7A is a schematic diagram illustrating results of stress analysis in the invention.
Figure 7B:
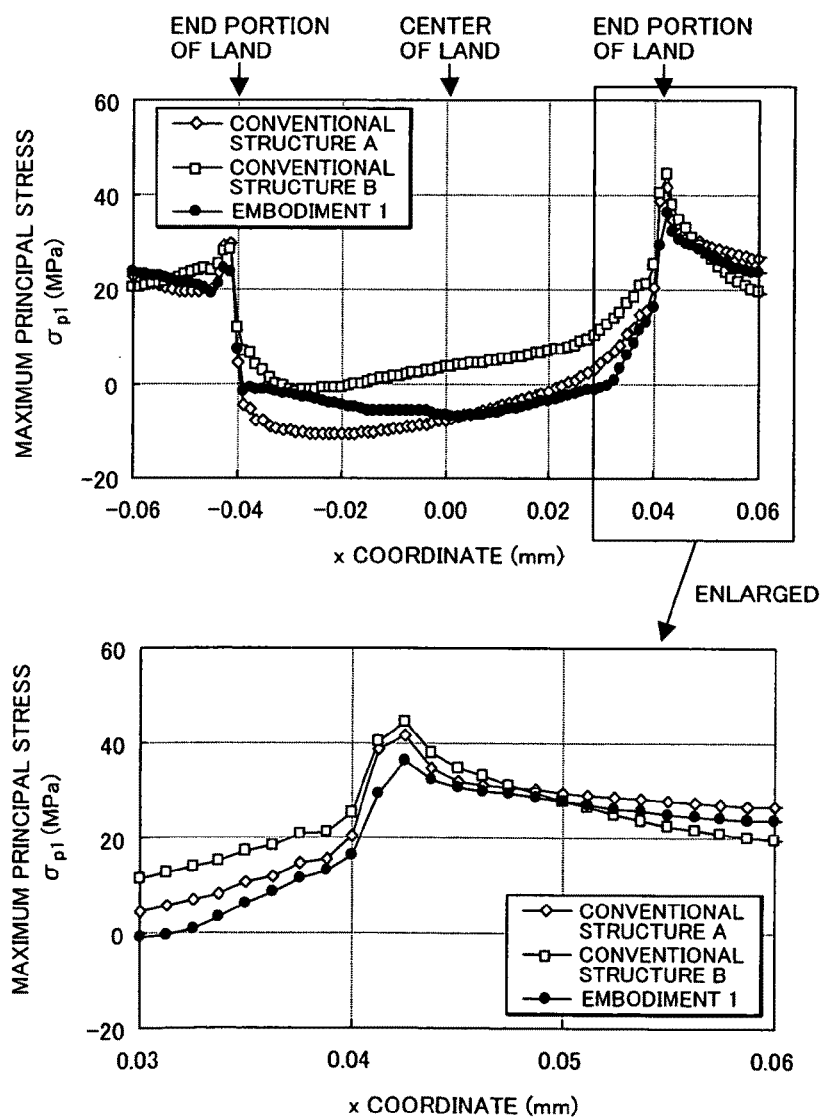
FIG. 7B is a graph illustrating results of stress analysis in the invention.

The maximum principal stress $\sigma p1$ distribution of the three structures in a pulling direction on the side of the insulating layer at the interface between the semiconductor-element-side land and the insulating layer is shown in the explanatory diagram FIG. 7A and graph 7B. FIG. 7A illustrates the X coordinate axis of the maximum principal stress $\sigma p1$ and the graph in FIG. 7B shows the stress apt distribution in the vicinity of the outermost connection.

In any of these structures, the maximum stress occurs in the vicinity of the land end portion on the right side of the drawing. When the maximum stress is compared among these connection structures, that of the conventional structure B is largest, while that of the structure of Embodiment 1 is smallest. From this fact, the insulating-layer stress reducing effect in Embodiment 1 can be confirmed.

It is however to be noted that the absolute stress of the land end portion cannot be evaluated because the shape or material thereof is discontinuous and it is a stress singular field in which the stress theoretically becomes ∞. Relative assessment was therefore carried out by using elements of the same size for the stress analysis in any of these connection structures. The acting direction of the maximum stress $\sigma p1$ varies, depending on the size, material quality, or the like of each element, but can be calculated by inputting a stress component at each point.

(Conditions of Applying Stress Reducing Mechanism)

The mechanism of reducing a stress in the insulating layer by employing the structure of Embodiment 1 was elucidated in the above description and verified by using the stress analysis model. Conditions under which the stress reducing mechanism of the invention can exhibit its effect will next be elucidated. There are a number of factors that should be considered upon designing of a connection.

From them, eight factors that were presumed to have a large influence were selected and they were arranged, as control factors A to H shown in FIG. 8A, into an orthogonal array called "L18 orthogonal array" as illustrated in FIG. 8B in order to assess the effect of these eight factors. If influences of the thus-selected eight factors on the insulating-layer stress are independent from each other, they can be assessed by analyzing 18 conditions shown in the orthogonal array. A numerical experiment was performed on two structures, that is, the structure of Embodiment 1 and the conventional structure A showing the second smallest stress after the structure of Embodiment 1.

Figure 9A:
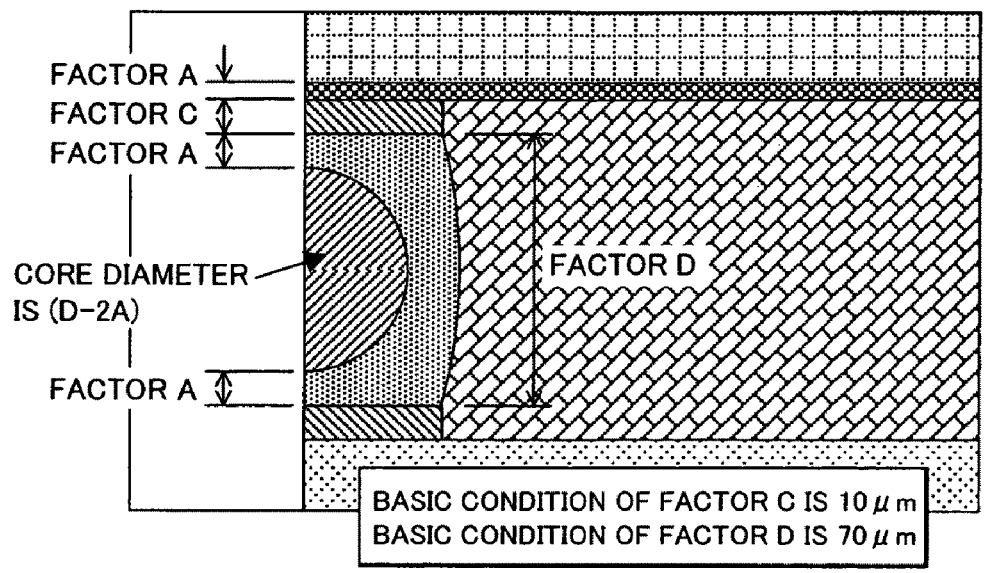
FIG. 9A is a schematic diagram illustrating the stress analysis conditions in the invention.
Figure 9B:
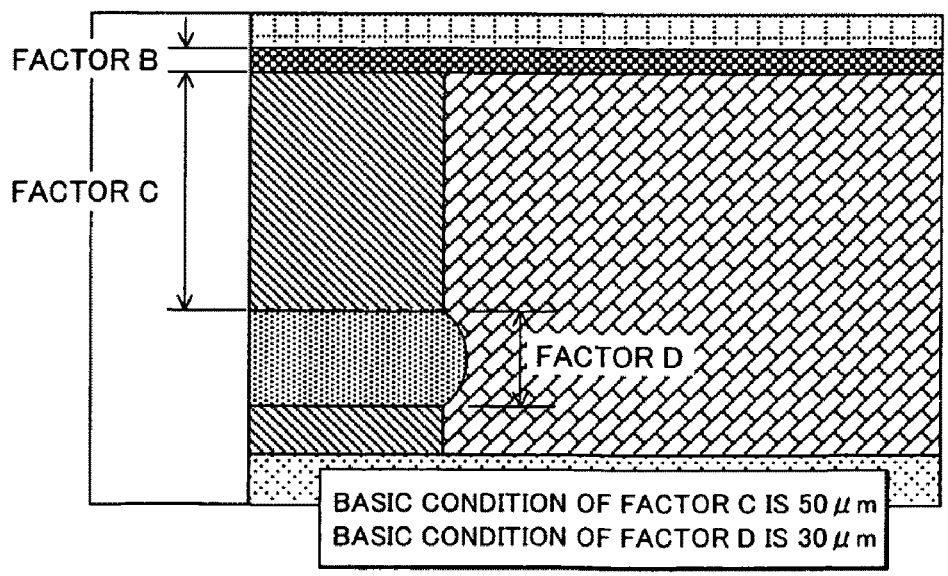
FIG. 9B is a schematic diagram illustrating the stress analysis conditions in the prior art.

In the schematic diagrams of FIGS. 9A and 9B, the positions of the dimension of each factor in the structure of Embodiment 1 and the conventional structure A are shown. It is however to be noted that Factor A meaning a "core-solder space" is a factor existing only in the structure of Embodiment 1. In the explanatory diagram of FIG. 10A, analysis results of the numerical experiment performed on the conventional structure A and the structure of Embodiment 1 under 18 conditions are shown. In FIG. 10B, an example of the maximum principal stress apt acting in an arrow direction is illustrated.

Figure 11:
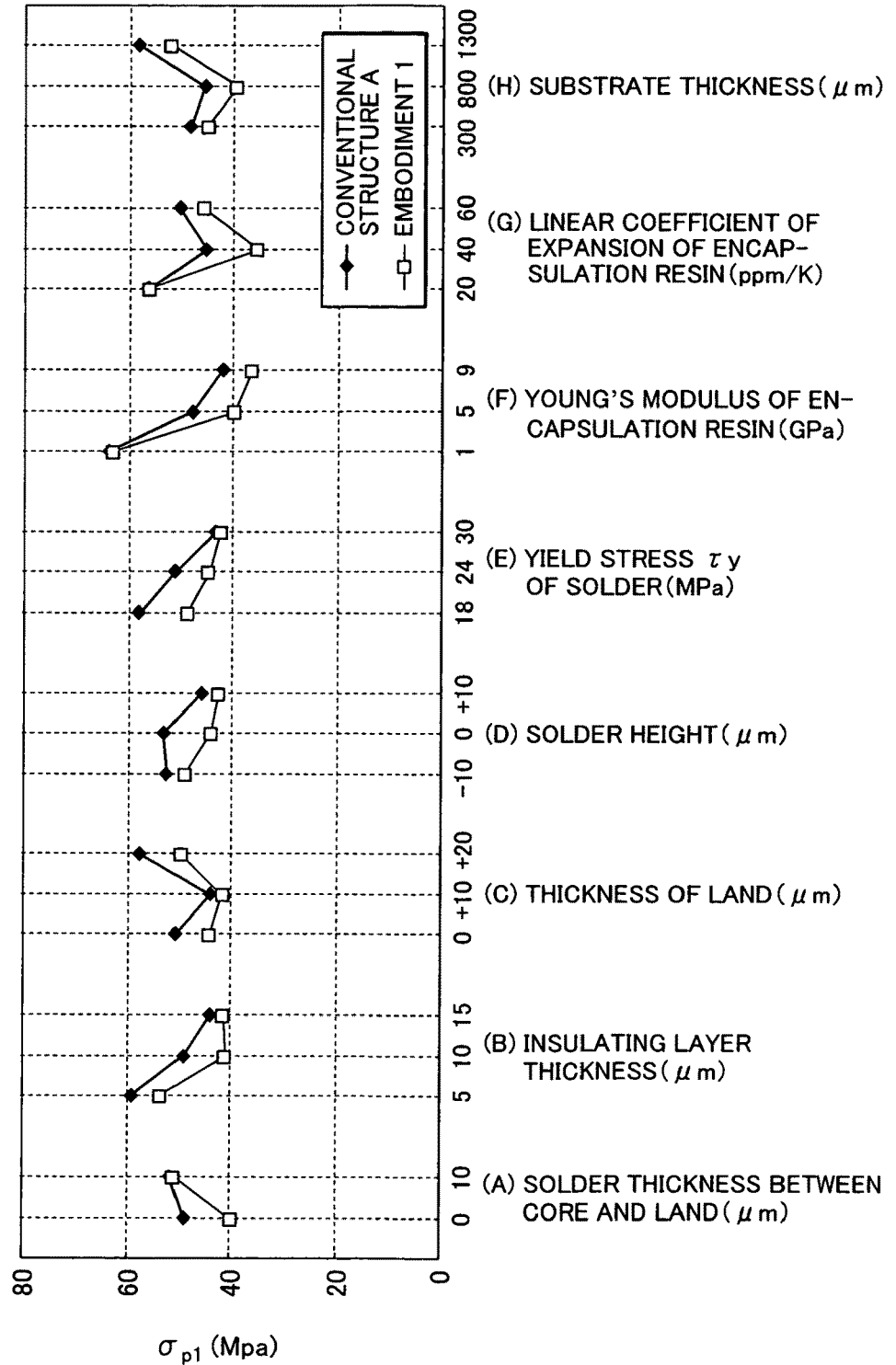
FIG. 11 is a graph showing the stress analysis results of the semiconductor device of Embodiment 1 of the invention.

In the numerical analysis, the maximum value of the principal stress $\sigma p1$ in a pulling direction which stress occurred in the insulating layer in the vicinity of the end portion of the semiconductor-element-side land (or protrusion) and was calculated in a similar manner to that of the stress distribution shown in FIGS. 7A, 7B were assessed. The graph of FIG. 11 shows the results, in terms of geometrical mean, of the stress at each level with respect to each factor based on the numerical experiment results found from FIG. 10. The effect of each factor can be assessed visually from FIG. 11.

When the (A) core-solder space (solder thickness between core and land) is 0 µm, the stress of the structure of Embodiment 1 is smaller than that of the conventional structure A. It can be confirmed that when it is 10 µm, no stress reducing effect is observed. In the numeral experiment, the terminal pitch is 0.13 mm. When the core-solder space is within a range of about 1/10 of the terminal pitch, the stress reducing effect is observable. With respect to (B) insulating layer thickness, (C) land thickness, (D) solder height, and (H) substrate thickness, the stress in the structure of Embodiment 1 is smaller than that in the conventional structure A on the whole, but a marked difference among levels cannot be observed. This suggests that a stress in the structure of Embodiment 1 becomes smaller than that of the conventional structure A because of not the effect of the factor itself but another factor. With respect to (E) solder yield stress ($\sigma y$) at room temperature, the stress reducing effect in the structure of Embodiment 1 is greatest at 18 MPa. The stress reducing effect can be observed even at 24 MPa, but it cannot be observed at 30 MPa. With respect to (F) Young's modulus of the encapsulation resin, no stress reducing effect is observed at 1 GPa and the effect appears at Young's modulus exceeding 1 GPa. With respect to (G) linear coefficient of expansion of the encapsulation resin, no stress reducing effect can be observed at 20 ppm/K and the effect appears at a linear expansion coefficient exceeding 20 ppm/K.

The conventional structure A does not have a core-solder space (solder thickness between core and land) parameter so that a difference in stress between two levels is very small. When the factors or levels arranged into the orthogonal array are inappropriate, there may occur a large change relative to a parameter which the structure does not have due to the influence of interactions among the other factors. A small influence of the core-land solder thickness on the conventional structure A therefore shows the appropriateness of this numerical experiment.

The numerical ranges will next be put together in consideration of the above-described results and practically known conditions. When the solder thickness between the land and the core is set at 1/10 or less of the terminal pitch and the Young's modulus and the linear coefficient of expansion of the encapsulation resin to be filled between the semiconductor element and the substrate and the yield stress of the solder at room temperature are set to satisfy the following inequalities:

1 GPa<(Young's modulus of the encapsulation resin) <30 GPa, 20 ppm/k<(linear coefficient of expansion of the encapsulation resin)<200 ppm/k, and 10 MPa<(yield stress of the solder at room temperature)<30 MPa, the insulating-layer stress reducing effect of Embodiment 1 can be obtained.

This appropriate range can be obtained for the first time by elucidating the insulating-layer stress reducing mechanism due to the flexural deformation of the land. When the mechanism is unknown as in the conventional technology, it is difficult to arrange factors or levels into an orthogonal array appropriately in using the Taguchi's method and the appropriate ranges cannot therefore be found.

(Numerical Experiment)

Referring to FIGS. 8A, 8B to 11, the ranges within which the stress reducing effect of Embodiment 1 can be achieved were elucidated. In order to confirm the appropriateness of the ranges again, results of the numerical experiment on all the combinations of three levels for the yield stress σy of the solder at room temperature, the Young's modulus of the encapsulation resin, and the linear coefficient of expansion of the encapsulation resin are shown in the explanatory diagram of FIGS. 12A and 12B.

The solder thickness between the core and the land is set at 10 μm. In the numerical experiment, the influence of the interaction of these factors can be assessed because all the combinations of these levels are examined.

Figures 12A, 12B:
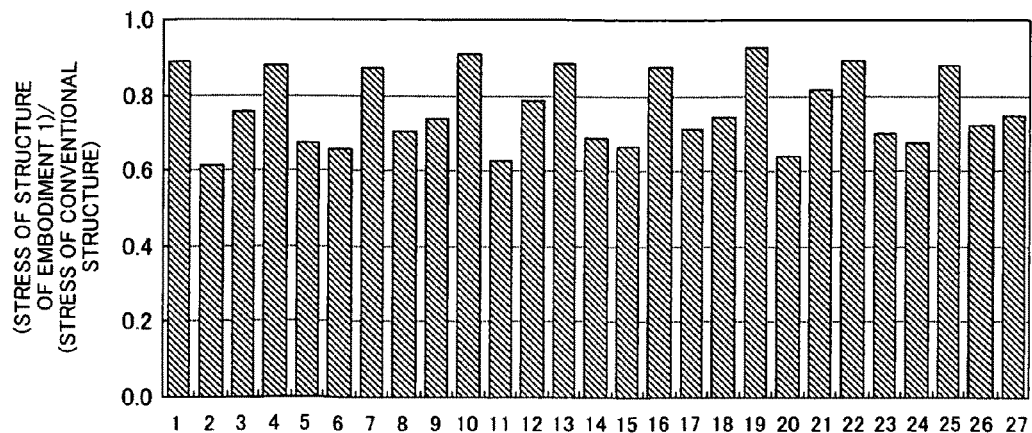
FIGS. 12A and 12B are explanatory diagrams illustrating the stress analysis results of the semiconductor device of Embodiment 1 of the invention.

Numerical experiments are performed on the conventional structure A and the structure of Embodiment 1 under 27 conditions and calculation results are shown in FIG. 12A. Graphs showing the respective stress ratios are shown in FIG. 12B. The stress of the structure of Embodiment 1 is smaller than that of the conventional structure A under any of the conditions. It has therefore been verified that the insulating-layer stress reducing effect of Embodiment 1 can be achieved when the Young's modulus and the linear coefficient of expansion of the encapsulation resin to be filled between the semiconductor element and the substrate and the yield stress of the solder at room temperature satisfy the following inequalities:

1 GPa<(Young's modulus of the encapsulation resin) <30 GPa, 20 ppm/k<(linear coefficient of expansion of the encapsulation resin)<200 ppm/k, and 10 MPa<(yield stress of the solder at room temperature)<30 MPa, while adjusting the solder thickness between the land and the core to not greater than 1/10 of the terminal pitch.

Figure 13:
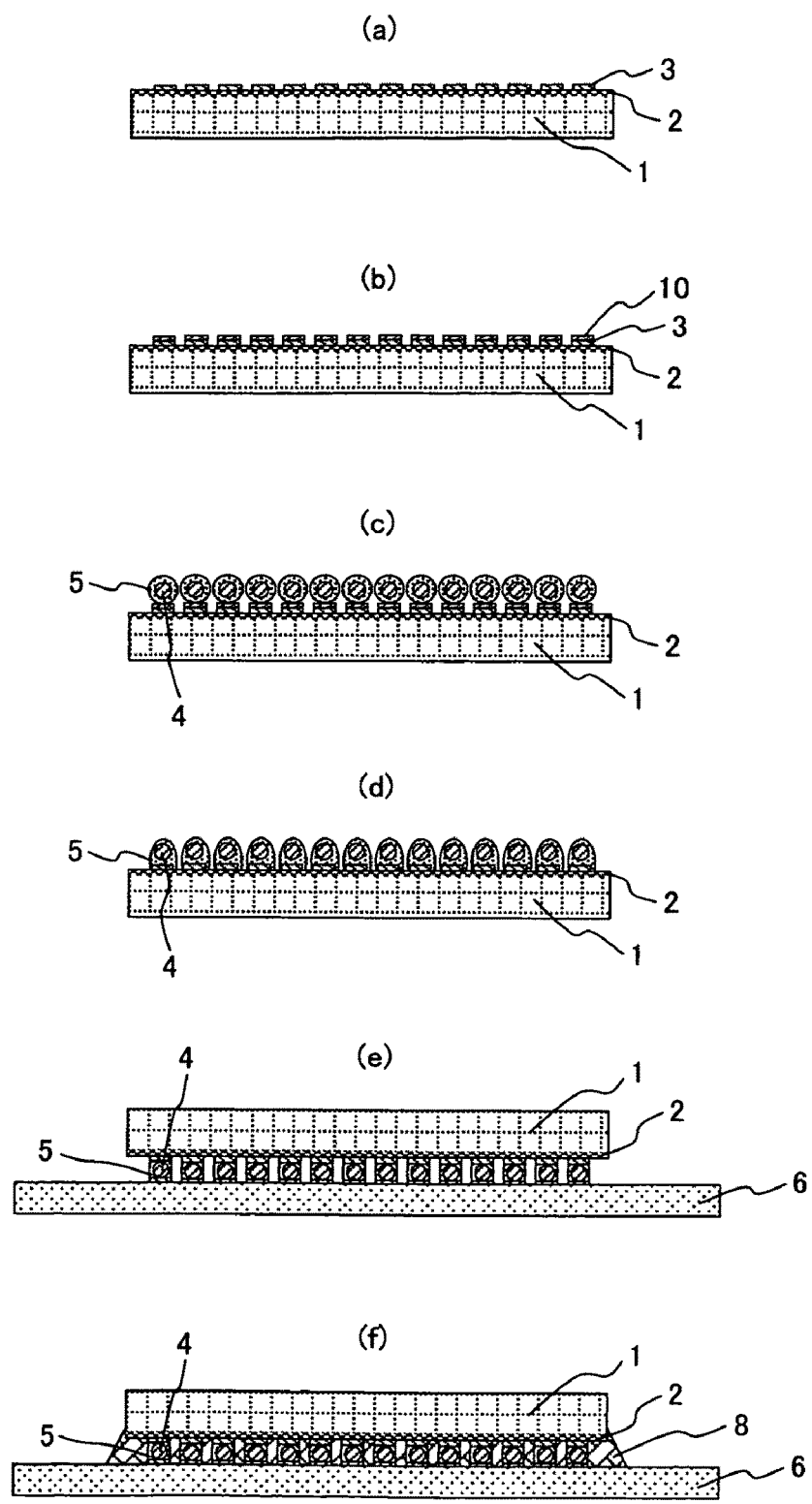
FIG. 13 is a schematic diagram illustrating a manufacturing method of the semiconductor device of Embodiment 1 of the invention.

FIG. 13 shows Steps (a), (b), (c), (d), (e), and (f) of the manufacturing method of the structure of Embodiment 1. First, in Step (a), a semiconductor element 1 having, on the surface thereof, semiconductor-element-side lands 3 and an insulating layer 2 is prepared. Next, in Step (b), a flux 10 is applied onto the surface of the semiconductor-element-side lands 3. In this Embodiment 1, a paste-like solder is used as the flux 10 and a mask for flux is used upon application.

Then, in Step (c), solder balls obtained by plating the surface of a core 4 with a solder 5 are placed on the semiconductor-element-side lands 3, respectively. The solder balls are fixed to the lands by utilizing viscosity of the flux. Then, in Step (d), the whole body is heated to a melting temperature of the solder or greater to melt the flux 10 and the solder 5 on the surface of the core 4, whereby metal contact with the semiconductor-element-side land 3 can be achieved.

Then, in Step (e), the semiconductor element 1 is turned over and placed over a semiconductor substrate 6 and the whole body is heated to a solder melting temperature or greater again, whereby the semiconductor element 1 is mounted on the substrate 6. In a final step (f), a encapsulation resin 8 is applied and filled to complete a semiconductor device.

Embodiment 2

Figure 14:
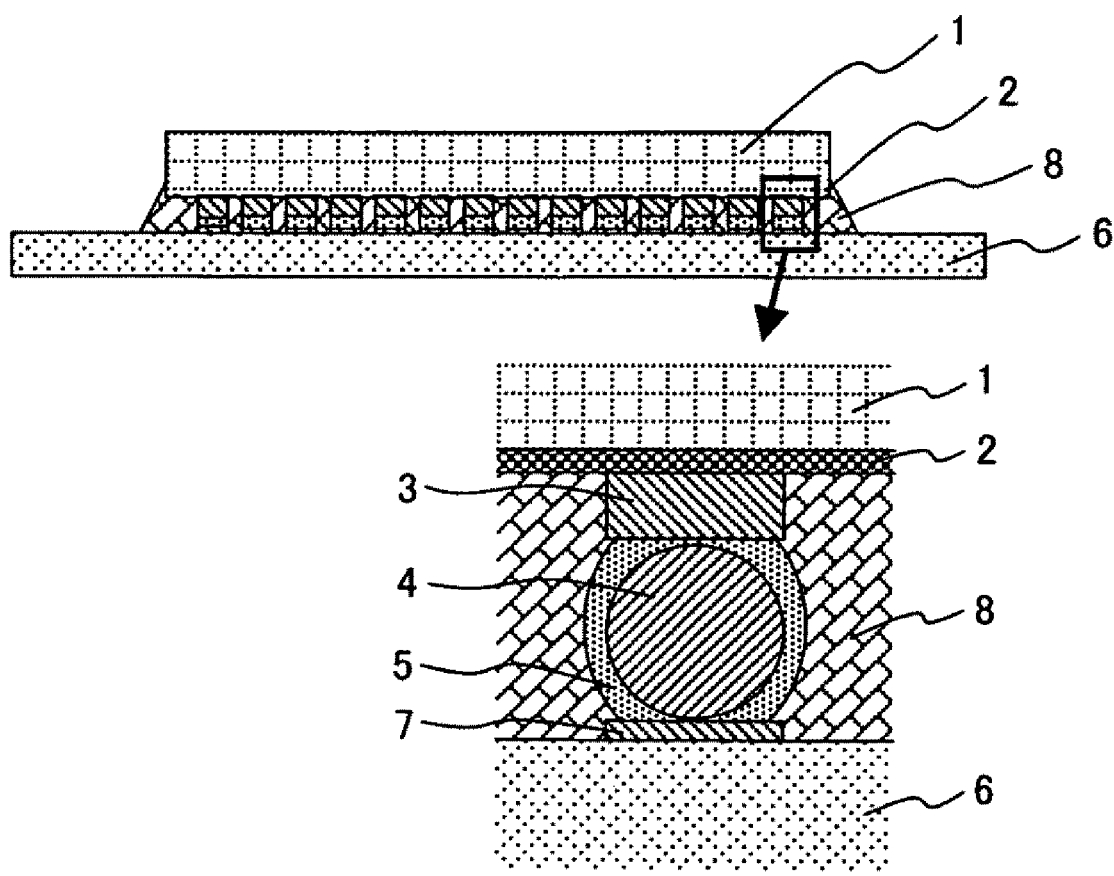
FIG. 14 is a schematic diagram illustrating the cross-section of a semiconductor device of Embodiment 2 of the invention.

FIG. 14 is a schematic diagram of the cross-section of a semiconductor device according to Embodiment 2 of the invention. A difference from the device of Embodiment 1 is that the thickness of a semiconductor-element-side land 3 in a joining direction is greater than that of a substrate-side land 7. The semiconductor-element-side land 3 has a rectangular cross-section whose thickness in the joining direction is smaller than that in the width direction.

In Embodiment 2, when the semiconductor-element-side land 3 is bent by the core 4, a compression load is applied to the center of the semiconductor-element-side land 3 by the core 4. When the semiconductor-element-side land 3 is thin, there may occur a large compression stress in an insulating layer 2 in the vicinity of the center portion of the semiconductor-element-side land 3 due to this compression load, but concentration of the compression load can be prevented or relaxed by thickening the semiconductor-element-side land 3 as in Embodiment 2.

Figure 15A:
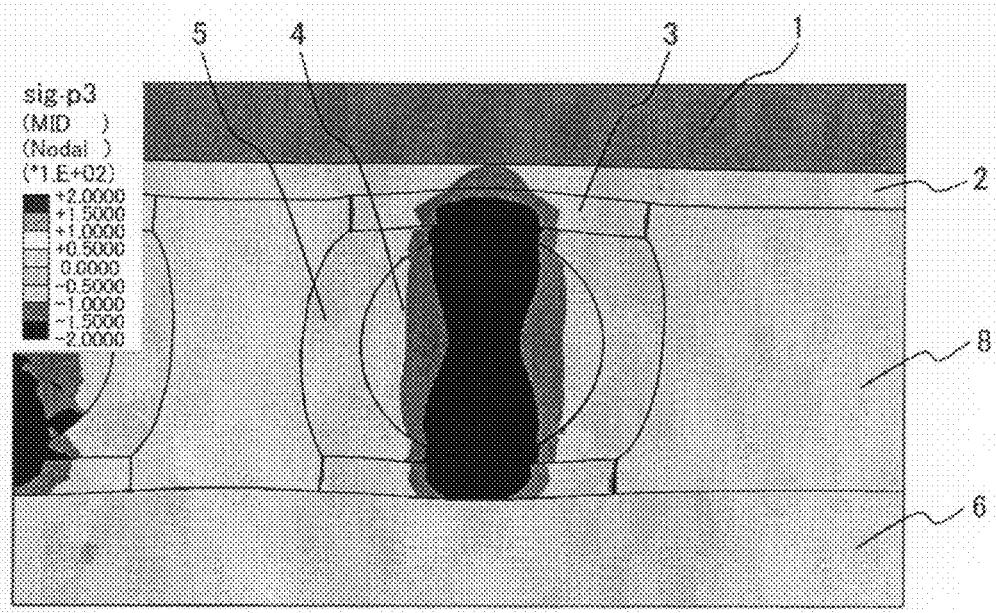
FIG. 15A is a deforming stress distribution chart of the semiconductor device of Embodiment 2 of the invention.
Figure 15B:
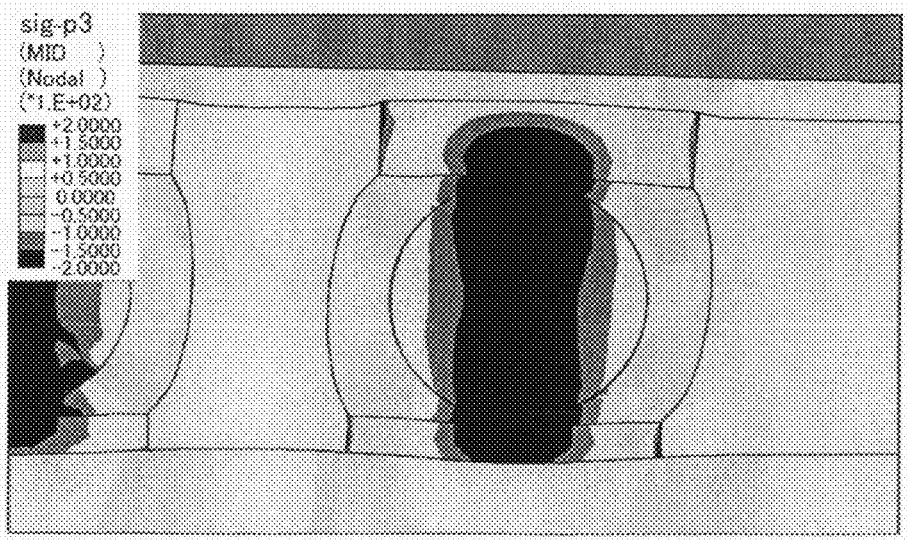
FIG. 15B is a deforming stress distribution chart of the semiconductor device of comparative example.

FIGS. 15A, 15B are distribution chart of a deforming stress including the principal stress σp3 in the compression direction when a temperature is decreased in the case where the semiconductor-element-side land 3 has a thickness of 10 μm and 20 μm. In FIG. 15A showing the case where the semiconductor-element-side land 3 has a thickness of 10 μm, the insulating layer 2 has a dark shaded region where a compression stress is large, while in FIG. 15B showing the case where the semiconductor-element-side land 3 has a thickness of 20 μm, the dark-shaded region in which the compression stress is large cannot be found in the insulating layer 2.

Figure 16:
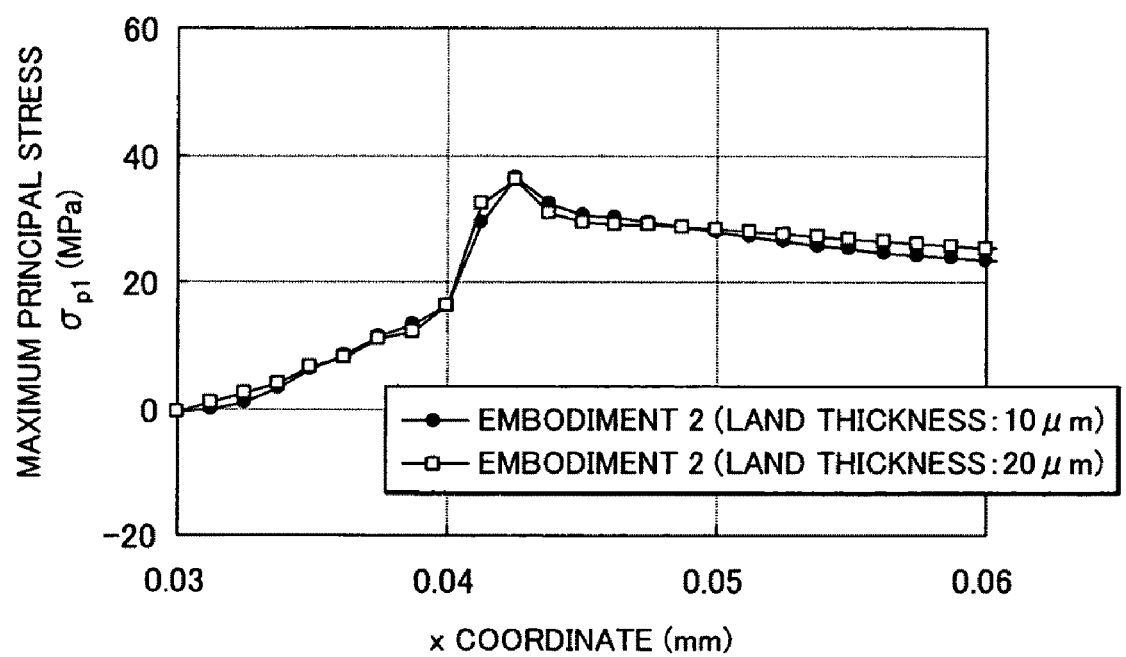
FIG. 16 is a graph showing the stress analysis results of the semiconductor device of Embodiment 2 of the invention.

The graph of FIG. 16 shows the distribution of the pulling-direction principal stress σp1 of the insulating layer in the end portion of the semiconductor-element-side land 3 when the temperature is decreased in the case where the semiconductor-element-side land 3 has a thickness of 10 μm and 20 μm.

It can be confirmed that the stress reducing effect in the insulating layer at the end portion of the semiconductor-element-side land 3 according to Embodiment 1 can be achieved even if the semiconductor-element-side land 3 is thickened. This occurs because in spite of thickening of the semiconductor-element-side land 3 which leads to an increase in flexural rigidity and an increase in curvature radius, an increase in a distance between the surface of the land and the flexural neutral plane enables to secure the flexural deformation amount of the land surface which diminishes the compression stress of the insulating layer 2.

The invention was described specifically based on some embodiments. It should however be borne in mind that the invention is not limited to or by these embodiments. It is needless to say that it can be changed without departing from the gist of it.

What is claimed is:

1. A semiconductor device comprising a semiconductor element having, over the surface thereof, an insulating layer having therein an interconnect, a substrate over which the semiconductor element is to be mounted, and a plurality of connection terminals provided over the surface of the insulating layer of the semiconductor element and the surface of the substrate at a certain pitch, the semiconductor element being mounted over the substrate by solder-joining the connection terminals over the surface of the insulating layer of the semiconductor element with the connection terminals of the substrate and the connection between the semiconductor element and the substrate being sealed with a encapsulation resin, wherein:

a substantially spherical core is provided inside of the solder at the connection between the semiconductor element and the substrate;

the thickness of the solder placed between the connection terminals provided over the surface of the insulating layer of the semiconductor element and the core is adjusted to 1/10 or less of a terminal pitch of the connection terminals over the surface of the insulating layer; and a Young's modulus and a linear coefficient of expansion of the encapsulation resin to be filled between the semiconductor element and the substrate, and a yield stress of the solder at room temperature are adjusted to satisfy the following inequalities: 1 GPa<(Young's modulus of the encapsulation resin)<30 GPa, 20 ppm/k<(linear coefficient of expansion of the encapsulation resin)<200 ppm/k, and 10 MPa<(yield stress of the solder at room temperature)<30 MPa.

2. The semiconductor device according to claim 1, wherein the core is made of a material having a greater rigidity than that of the solder.

3. The semiconductor device according to claim 2, wherein the core is made of nickel-plated copper.

4. The semiconductor device according to claim 2, wherein the core is made of nickel.

5. The semiconductor device according to claim 2, wherein the core is made of molybdenum.

6. The semiconductor device according to claim 2, wherein the connection-direction thickness of the connection terminals over the surface of the insulating layer of the semiconductor element is greater than the connection-direction thickness of the connection terminals over the substrate.

7. The semiconductor device according to claim 6, wherein the connection terminals over the surface of the insulating layer of the semiconductor element has a rectangular cross-section in which the connection-direction thickness is smaller than the width-direction thickness.

* * * * *